United States Patent [19]

Majefski

[11] Patent Number: 4,525,684

[45] Date of Patent: Jun. 25, 1985

[54] AUTO-EQUALIZER APPARATUS

[75] Inventor: Richard L. Majefski, Richardson, Tex.

[73] Assignee: Rockwell International Corporation, El Segundo, Calif.

[21] Appl. No.: 623,902

[22] Filed: Jun. 25, 1984

[51] Int. Cl.$^3$ .......................... H03F 1/91; H03H 5/00
[52] U.S. Cl. ................................ 330/304; 333/28 R; 330/278
[58] Field of Search ............... 330/278, 279, 284, 304; 333/28 R

[56] References Cited

U.S. PATENT DOCUMENTS 4,220,931  9/1980  Hines et al. ......................... 330/284

Primary Examiner—James B. Mullins
Assistant Examiner—G. Wan
Attorney, Agent, or Firm—Bruce C. Lutz; V. Lawrence Sewell; H. Fredrick Hamann

[57] ABSTRACT

An auto-equalizer for passing data pulses of the type which tries to restore the relative amplitude of the first and third harmonics of the data signal frequency while deemphasizing the amplitude of other higher harmonics. The present invention accomplishes the relative harmonic amplitude restoration by controlling the resistance in a tuned circuit element affecting the gain of a signal passing amplifier. The adjustment of the resistance directly affects the Q of the tuned circuit involved.

3 Claims, 3 Drawing Figures

AUTO-EQUALIZER APPARATUS

THE INVENTION

The present invention is generally related to electronics and more specifically related to auto-equalizer circuits.

BACKGROUND

While there are many auto-equalizer circuits on the market, the known circuits suffer from various design and reliability problems. Many of these auto-equalizer circuits operate on the basis of attempting to restore the relative amplitudes of the first and third harmonics of a pulse type signal while deemphasizing the amplitude of higher harmonics involved in the pulse train of data signals. Typically, this restoration of relative amplitudes involves the variation of one or both of the reactance types involved in a tuned circuit which tuned circuit affects the amplification factor of a stage of a circuit. The amplification factor may be either positive or negative (attenuation). Typically, the prior art has required further amplification and automatic gain control after the auto-equalizer section. Thus, a plurality of feedback loops and associated additional parts have been eliminated by the present concept which allows the same pulse amplitude detector to be used to drive the automatic gain control amplifier as is used to adjust the relative amplitudes of the first and third harmonics via the tuned circuit.

It is accordingly an object of the present inventive concept to provide an improved auto-equalizer design.

Other objects and advantages of the present invention may be ascertained from a reading of the specification and appended claims in conjunction with the drawings wherein:

DETAILED DESCRIPTION

Figure 1:
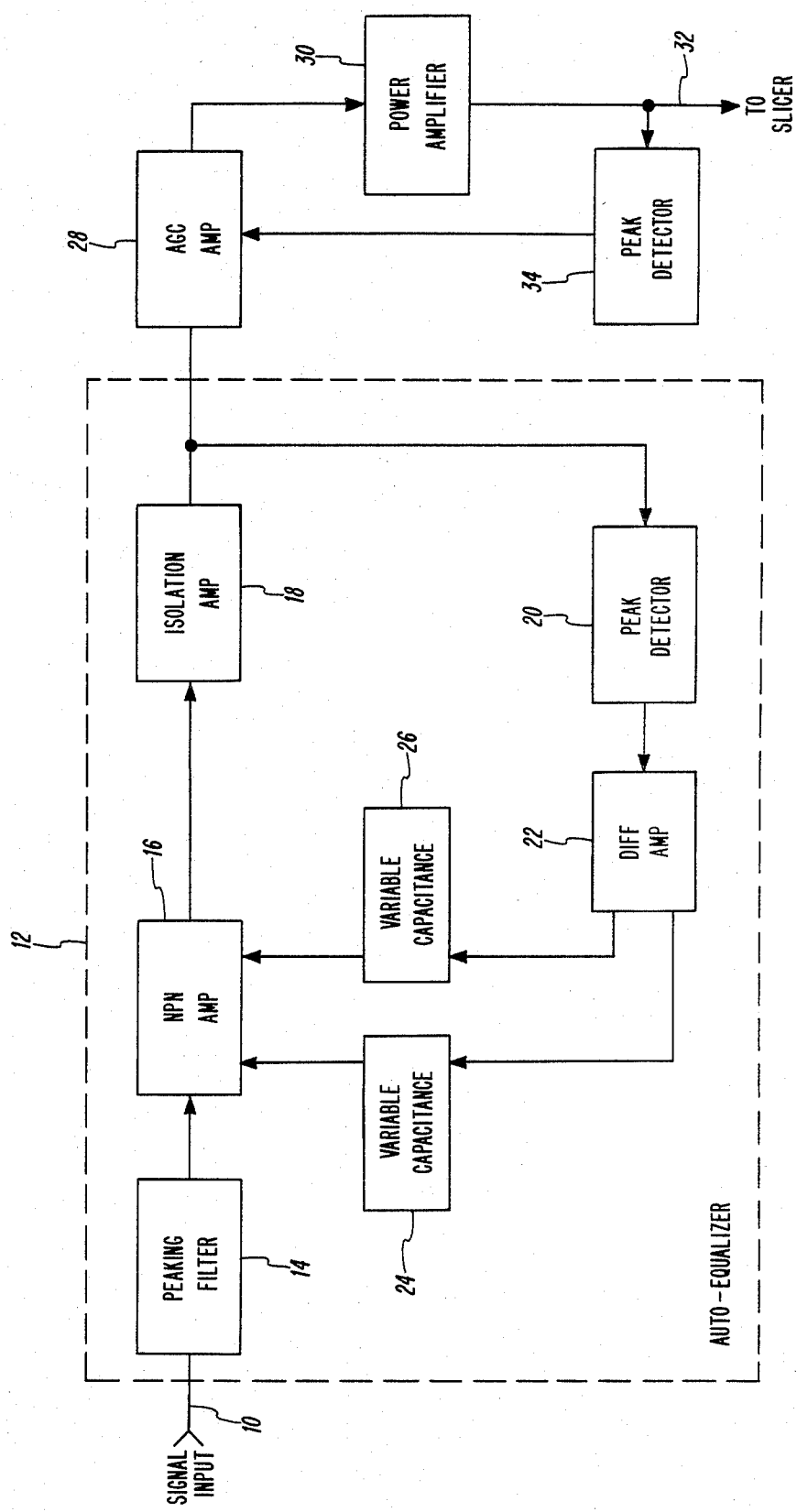
FIG. 1 is a block diagram of a prior art design.

In FIG. 1 a signal comprising a train of pulses is input on a lead 10 to a dash line block 12 containing the auto-equalizer section of the circuit shown. The lead 10 is supplied to a peaking filter 14 which passes the signal to an NPN amplifier 16 and on to an isolation amplifier 18. A feedback circuit comprising a peak detector 20, a differential amplifier 22 and two variable capacitors 24 and 26 return signals to the NPN amplifier 16. The output of isolation amplifier 18 is also the output from the auto-equalizer block 12. This output signal is supplied to an AGC amplifier 28 which outputs signals through a power amplifier 30 to an apparatus output 32. This output signal on lead 32 is also supplied to a peak detector 34 and returned as a feedback signal to the AGC amplifier 28.

Figure 2:
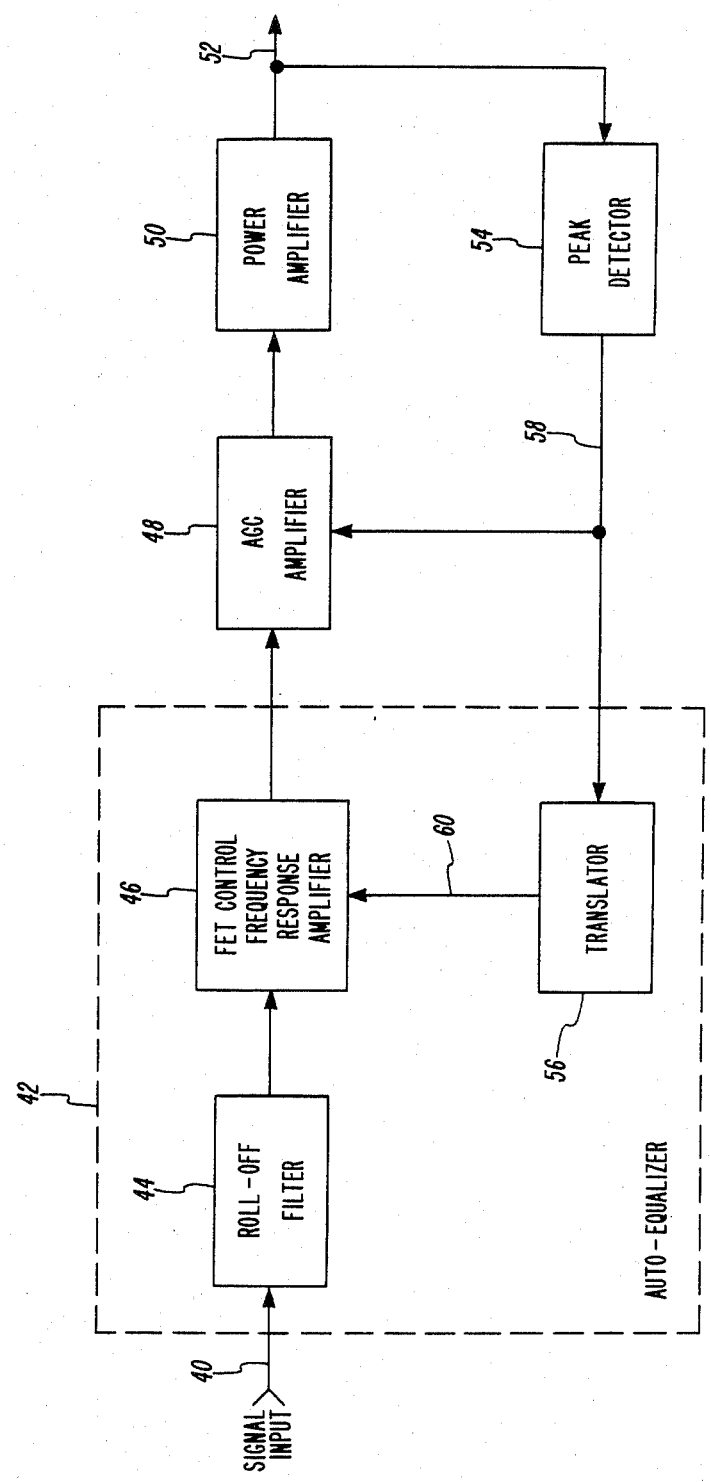
FIG. 2 is a block diagram of the present inventive concept.

In FIG. 2 a pulse train of signals is supplied on an input lead 40 to a dash line block diagram 42 labeled autoequalizer. Within auto-equalizer 42 a roll-off filter 44 receives the input signals supplied on lead 40. An output signal from roll-off filter 44 is supplied to an FET control frequency responsive amplifier 46 having an output signal supplied to the output of auto-equalizer 42 and thence to an AGC amplifier 48. An output of amplifier 48 is supplied to a power amplifier 50 which supplies apparatus output signals to a lead 52 and to a feedback input of a peak detector 54. An output of peak detector 54 is supplied to a control input of AGC amplifier 48 and to a translator 56 within block 42 via a lead 58. An output of translator 56 is supplied on a lead 60 to the amplifier 46.

In one embodiment of the invention, the pulse train on lead 40 operated at 44 megabits per second which equates to a fundamental frequency of 22 megahertz whereby the third harmonic was 66 megahertz and the fifth harmonic was 110 megahertz. As is well understood by those skilled in the art, the bit rate as defined by digital engineers is twice the fundamental frequency.

Figure 3:
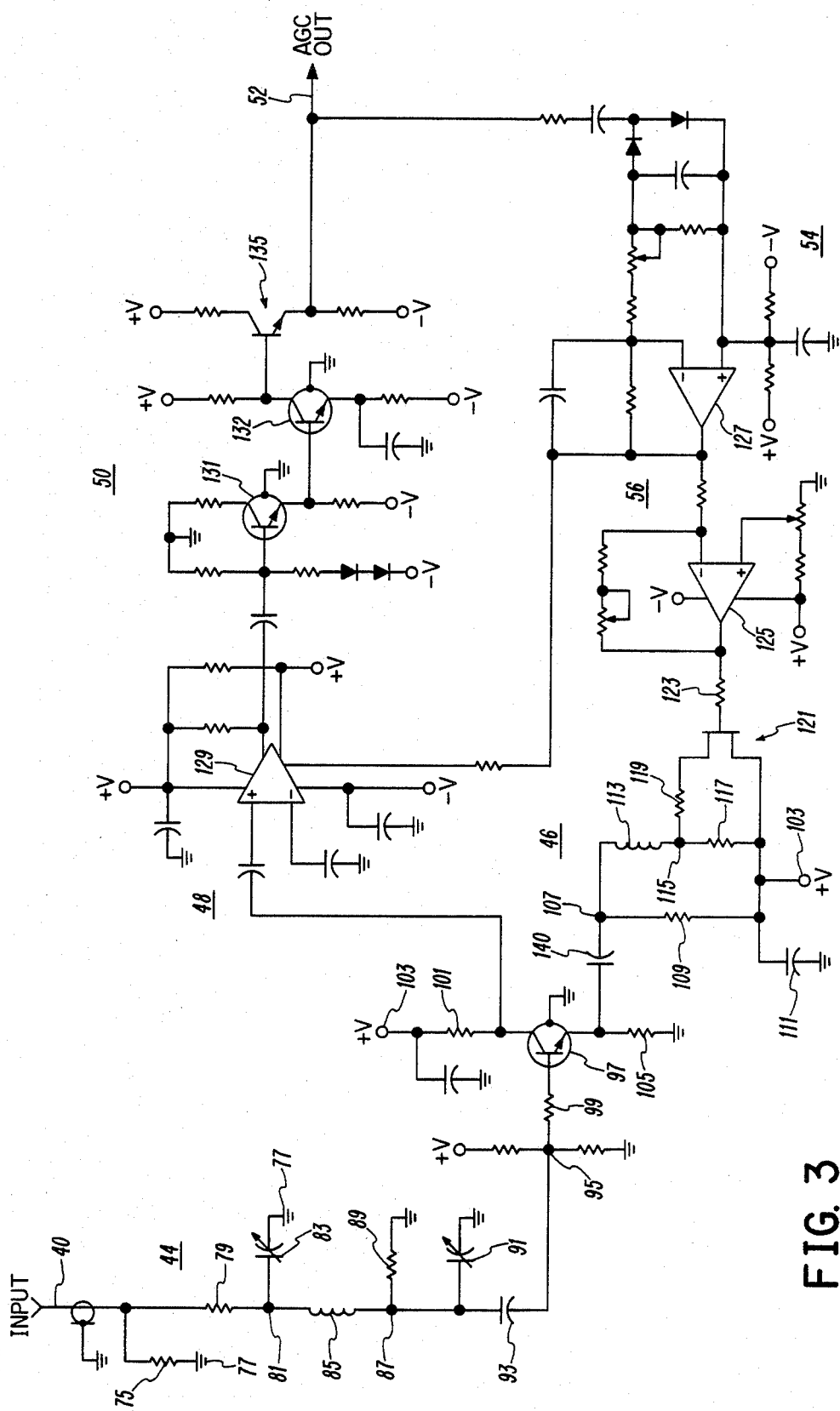
FIG. 3 is a detailed schematic diagram of the block diagram illustrated in FIG. 2.

In FIG. 3 the same designations as used in FIG. 2 are supplied where appropriate to help the reader visualize the general function of the components.

Within FIG. 3 there is shown a resistor 75 connected between input 40 and ground 77. A resistor 79 is connected between input 40 and a junction point generally designated as 81. A variable or adjustable capacitance 83 is connected between junction point 81 and ground 77. An inductive element 85 is connected between junction point 81 and junction point 87. A resistor 89 and a variable capacitance 91 are connected in parallel between junction point 87 and ground 77. A capacitor 93 is connected between junction point 87 and a junction point 95. A transistor 97 of the NPN type has a base connected through a resistor 99 to junction point 95. Transistor 97 further has a collector element connected through a or resistor 101 to a positive power supply 103. A resistor 105 is connected between the emitter of transistor 97 and ground 77. The emitter is also connected through a capacitor 140 to a junction point 107. A resistor 109 is connected between junction point 107 and the positive power terminal 103. A capacitor 111 is connected between power supply 103 and ground 77. An inductive element 113 is connected between junction point 107 and a further junction point 115. A resistor 117 is connected between junction point 115 and positive power terminal 103. A further resistive element 119 is connected in series with the drain and source leads of an FET transistor generally designated as 121 and having one of its source and drain leads connected to positive power terminal 103. A resistor 123 is connected to the gate of FET 121. The circuit generally designated as 56 has an operational amplifier chip 125 which in one embodiment of the invention was a 1458 manufactured by various companies such as Motorola. A similar amplifier chip 127 is contained in the peak detector portion of the circuit. A wide band differential amplifier 129 is contained in the AGC amplifier 48 and in one embodiment of the invention was a 1590 differential amplifier chip manufactured by various companies such as Motorola. The two NPN transistors 131 and 132 are both of the type 2N918 in one embodiment of the invention while the final transistor 135 of the power amplifier in one embodiment of the invention was a 2N3866.

Since the design of the circuitry is reasonably straightforward, other than the tuned circuit frequency responsive amplifier 46, further designators or explanation will not be provided of the detailed circuit diagram of FIG. 3.

OPERATION

As is well known to those skilled in the art, data transmission lines suffer from frequency response roll-off with increased length resulting in greater susceptibility to environmental electromagnetic noise. This environmental electromagnetic noise lowers the system bit error rate (BER) performance. To alleviate the problem, line lengths may be restricted or a response equalizer may be inserted into the line. Equalizers may be used solely or in conjunction with line build-out (LBO) networks and attenuators to minimize the number of specific networks required to equalize all line lengths required by the data system specification. These techniques require significant amounts of test time for the networks and the required related data receiver circuitry to insure that any network will function properly with any receiver. The alternative to extensive testing is auto-equalization techniques such as illustrated in this concept. The automatic equalization also eliminates the reequalization of the prior art circuits required in the field as necessitated by significant changes in cable length or module restrapping due to normal spares stocking practices. Thus, although the cost of the automatic equalizer circuit itself may be higher than LBO networks, the overall cost and efficiency of a unit over a period of time is or can be considerably less using automatic equalization than using prior art techniques.

In the prior art circuit of FIG. 1, the data signal input on lead 10 is fed through the peaking filter 14 which passes energy near the third harmonic of the data rate with very little attenuation. This peaking filter equally attenuates the energy near the fundamental and fifth harmonic of the data rate. The signal is then fed to the NPN amplifier 16 having voltage controlled LC networks using varicaps illustrated as blocks 24 and 26. The varicaps or variable capacitors are used to vary the amplifier's frequency response as a compensation for the roll-off characteristics of the signal supplying device. In one application of the invention, the signal supplying means was a length of cable transmitting the data. The LC networks utilized by the amplifier require a matched differential driver such as block 22 to properly apportion the equalization task between the two LC networks. As illustrated, a peak detector 20 is utilized to sample the output signal level of the auto-equalizer 12 and control the discrete transistor differential amplifier 22. Finally, the isolation amplifier 18 is used to provide isolation for the LC networks, gain for the peak detector 20 and a low impedance signal source driver to the AGC amplifier. As illustrated, the AGC amplifier uses a power amplifier to provide an output and a further peak detector 34 to return feedback signals to keep the output 32 substantially constant.

The present invention, as illustrated in FIG. 2, is able to use a low pass or roll-off filter 44 on the input to the auto-equalizer 42. The data signal on lead 40 is fed to the roll-off filter which passes energy in the frequency band from the fundamental to the third harmonic of the data rate and attenuates the energy at the fifth harmonic and higher of the data rate. It has been found both experimentally and with theoretical computations that fifth harmonic energy contributes little to the quality of the data signal but this fifth harmonic energy can appear as baseline noise if it is over-equalized. Further, a roll-off filter, which is extremely similar to a low-pass filter, is cheaper or more economical to produce and manufacture than is a peaking filter such as 14 of FIG. 1. The band limited signal output by roll-off filter 44 is supplied to an NPN amplifier shown as block 46 with one voltage controlled LC network in the emitter circuit. The LC circuit varies the amplifier's frequency response to compensate for data source roll-off characteristics. As previously implied, the present invention was designed to compensate for distortion of data signals transmitted through cables or other data transmission lines. The voltage controlled LC network of the present invention differs from that of the prior art in that the effective reactive component values are not varied. Instead, the Q of the LC circuit is varied by a field effect transistor (FET 121) operated as a voltage controlled resistor. The amplifier provides little gain at the fundamental frequency and just offsets the roll-off filter response at the fifth harmonic at maximum equalization. Thus, the energy level at the fundamental is varied little and the fifth and higher harmonic energy is maintained at or below the optimum equalization level while the third harmonic energy is varied to compensate for the cable roll-off characteristic. The above is a description using technical terms of a technique for attempting to reestablish the original relative values of fundamental, third and fifth harmonic amplitude relationships in the signal as originally generated before being passed through a data transmission line.

The output of the NPN amplifier 46 is fed to an AGC amplifier 48 of the same type as illustrated in FIG. 1 as block 28. The output of the AGC amplifier is supplied to power amplifier 50 and a feedback circuit using peak detector 54 supplies feedback signals to the AGC amplifier 48. However, this same feedback signal from peak detector 54 is utilized to supply level indicative signals to a translator 56 which supplies control signals to the FET in the LC network of amplifier 46. The reason for translator 56 is that the FET requires a different pedestal voltage and a larger control voltage variation than the AGC amplifier 48. The translator 56 adjusts the gain of the signal passing through. While the translator 56 is not required in FIG. 1, the use of the translator eliminates the extra peak detector 20 of FIG. 1 and the concept of varying the Q rather than a reactive component of the LC network eliminates the differential amplifier 22 and the two varicaps 24 and 26. Thus, the savings in components from eliminating the peak detector, the differential amplifier, the varicaps and the isolation amplifier provides for a considerably simpler circuit. In addition, it is very difficult to obtain varicaps which are consistent in characteristics. Thus, typically compensation circuits must be used to overcome the effect of component characteristic variability.

The detailed circuit diagram of FIG. 3 is believed reasonably self-explanatory and it is believed obvious from the previous discussion that the operational amp 125 and its associated circuitry provides the translation of block 56 of FIG. 2 and adjusts the resistance of FET 121 which is in series with the LC circuit of capacitor 140 and inductance 113. The adjustment of Q of this emitter circuit load will certainly alter the amplification factor of transistor 97 within the frequency responsive amplifier block 46.

Although a specific type of LC circuit has been illustrated along with a specific type of amplifier and roll-off filter, I wish to be limited not by the single embodiment illustrated but only by the inventive concept as defined in the appended claims wherein I claim:

1. Auto-equalizer apparatus comprising, in combination:
   roll-off filter means including first signal input means and output means;
   means for supplying a pulse train type signal to be equalized to said input means of said filter means;

variable Q tuned circuit means, including second signal input means and apparatus signal output means, and further including variable impedance resistance means having a control input;

means connecting said output means of said filter means to said signal input means of said tuned circuit means; and peak detector means, connected between said apparatus signal output means of said tuned circuit means and said control input means of said tuned circuit means, for providing thereto a feedback control signal which adjusts the resistance of said variable impedance resistance means toward a value which tends to maintain a substantially constant amplitude train of pulses at said apparatus output means.

2. Apparatus as claimed in claim 1 wherein said tuned circuit means includes:

AGC (automatic gain control) amplifier means for adjusting the amplitude of the pulse train being equalized toward a constant value, said AGC amplifier means including control input means for also receiving feedback control signals from said peak detector means.

3. Auto-equalizer means comprising, in combination:

roll-off filter means including first signal input means and output means;

pulse train signal supply means for supplying a train of pulses to be equalized and amplitude adjusted, conneted to said signal input means of said roll-off filter means;

tuned amplifier means including second signal input means connected to said output means of said filter means, signal output means and first control signal input means, said tuned amplifier means including a tuned circuit having a solid state variable resistance means in addition to and in series with a tuned portion comprising an inductance means and a capacitive means, said tuned circuit affecting the amplification factor of said tuned amplifier means as a function of the Q of said tuned circuit, said tuned amplifier means being operable to adjust the amplitude values of the first and third harmonics of said pulse train toward their original relative values before degradation of the pulse train from that originally generated and further operating to adjust higher harmonics of the pulse train toward a minimal amplitude relative the amplitude of said first harmonic before outputting the adjusted pulse train at said output means of said tuned circuit amplifier means;

AGC (automatic gain control) amplifier means including second control signal input means, signal output means and further including third signal input means connected to receive output signals from said output means of said tuned amplifier means;

peak detector means including feedback signal input means and further including control signal output means connected to said control signal input means of each of said tuned amplifier means and AGC amplifier means; and apparatus output means connected to said output means of said AGC amplifier means for providing auto-equalized and amplitude adjusted output signals and to said feedback signal input means of said peak detector means for supplying output signals thereto.

* * * * *